(12) United States Patent
Gipson et al.

(10) Patent No.: US 11,157,096 B2
(45) Date of Patent: Oct. 26, 2021

(54) FOLDABLE FLEXIBLE CIRCUIT BOARD

(71) Applicant: Dura Operating, LLC, Auburn Hills, MI (US)

(72) Inventors: Ron G. Gipson, Metamora, MI (US); Bhanumurthy Veeragandham, Auburn Hills, MI (US)

(73) Assignee: DUS Operating, Inc., Auburn Hills, MI (US)

( * ) Notice: Subject to any disclaimer, the term of this patent is extended or adjusted under 35 U.S.C. 154(b) by 279 days.

(21) Appl. No.: 16/376,594

(22) Filed: Apr. 5, 2019

(65) Prior Publication Data

US 2020/0319727 A1    Oct. 8, 2020

(51) Int. Cl.

| | |
|---|---|
| *G06F 3/0354* | (2013.01) |
| *H01L 23/538* | (2006.01) |
| *H01L 25/075* | (2006.01) |
| *H01L 33/58* | (2010.01) |
| *H01L 33/62* | (2010.01) |
| *H05K 1/02* | (2006.01) |
| *B60R 13/04* | (2006.01) |
| *F21V 8/00* | (2006.01) |
| *B60Q 1/26* | (2006.01) |

(52) U.S. Cl.
CPC .......... *G06F 3/03547* (2013.01); *B60R 13/04* (2013.01); *G02B 6/0073* (2013.01); *H01L 23/5387* (2013.01); *H01L 25/0753* (2013.01); *H01L 33/58* (2013.01); *H01L 33/62* (2013.01); *H05K 1/028* (2013.01); *B60Q 1/26* (2013.01); *H05K 2201/055* (2013.01); *H05K 2201/09063* (2013.01); *H05K 2201/09754* (2013.01)

(58) Field of Classification Search
CPC ............ G06F 3/03547; H01L 23/5387; H01L 25/0753; H01L 33/58; H01L 33/62; H05K 1/028; H05K 2201/055; H05K 2201/09063; H05K 2201/09754; B60R 13/04; G02B 6/0073
See application file for complete search history.

(56) References Cited

U.S. PATENT DOCUMENTS

| | | | |
|---|---|---|---|
| 4,228,330 | A | 10/1980 | Larson |
| 5,680,160 | A | 10/1997 | LaPointe |
| 7,583,508 | B2 | 9/2009 | Hagiwara et al. |
| 2006/0026821 | A1 | 2/2006 | Stevenson et al. |
| 2008/0185281 | A1 | 8/2008 | Chang et al. |
| 2012/0071204 | A1 | 3/2012 | Sakashita et al. |
| 2017/0090661 | A1* | 3/2017 | Kim ................... H01L 27/3276 |

* cited by examiner

*Primary Examiner* — Thomas M Sember
(74) *Attorney, Agent, or Firm* — Vivacqua Crane

(57) ABSTRACT

A flexible circuit board includes a flexible substrate having a first portion, a second portion, and a first side defining part of the first portion and the second portion. Electrical components are disposed on the first side in the first portion and in the second portion. The flexible substrate is folded between the first portion and the second portion such that the first portion overlays the second portion and the first side is directed outwards.

18 Claims, 4 Drawing Sheets

FOLDABLE FLEXIBLE CIRCUIT BOARD

FIELD

The present invention relates to a foldable flexible circuit board, and more particularly to a foldable flexible circuit board used in a trim part for a motor vehicle.

BACKGROUND

The statements in this section merely provide background information related to the present disclosure and may or may not constitute prior art.

An exterior trim part for a motor vehicle may include a rigid substrate or support member that has an outer decorative surface and an inner support surface. The outer decorative surface may have a high quality finish, such as a glossy surface. The inner support surface may include flanges and other features to fasten the exterior trim part to the motor vehicle and to provide structural rigidity to the substrate. An acrylic, translucent front face is disposed overtop the outer decorative surface. Exterior trim parts for motor vehicles may also include human machine interface (HMI) devices used to externally control certain features of the motor vehicle. The HMI may include a rigid circuit board that provides capacitive touch, lighting, etc.

However, many trim parts for motor vehicles are curved, which may increase stress on the rigid circuit board. Flexible circuit boards, which are bendable relative to the rigid circuit board, typically do not provide the functionality of a rigid circuit board. Therefore, there is a need in the art to provide HMI devices which combine the advantages of rigid circuit boards with the bendability of flexible circuit boards.

SUMMARY

In accordance with an aspect of the present disclosure, a flexible circuit board is provide. The flexible circuit board includes a flexible substrate having a first portion, a second portion, and a first side defining part of the first portion and the second portion. Electrical components are disposed on the first side in the first portion and in the second portion. The flexible substrate is folded between the first portion and the second portion such that the first portion overlays the second portion and the first side is directed outwards.

In one aspect, the electrical components include an LED on the first side in the first portion, wherein a light from the LED is provided to the first side of the second portion.

In another aspect, the first portion includes a first opening and the second portion includes a second opening, the LED disposed adjacent the first opening.

In another aspect, a light guide is disposed in the first opening and configured to direct the light from the LED through the second opening.

In another aspect, the electrical components include a capacitive touch sensor disposed on the first side in the second portion.

In another aspect, the capacitive touch sensor is disposed around the second opening.

In another aspect, the first opening is aligned with the second opening when the flexible substrate is folded.

In another aspect, an adhesive tape is disposed on a second side of the flexible substrate, wherein the adhesive tape adheres the first portion to the second portion.

In another aspect, the adhesive tape includes a hole in alignment with the first opening and the second opening when the flexible substrate is folded.

In another aspect, the electrical components include an LED disposed on the first side in the first portion and a capacitive touch sensor disposed on the first side in the second portion.

In another aspect, a spacer is disposed on a second side of the flexible substrate, wherein the spacer contacts the first portion and the second portion.

In another aspect, the first portion is disposed longitudinally adjacent the second portion and the flexible substrate is folded longitudinally.

In another aspect, the first portion is disposed laterally adjacent the second portion and the flexible substrate is folded laterally.

In another aspect, the flexible substrate includes slits disposed between the first portion and the second portion along a fold line.

In another aspect, a connector is integrated into the flexible substrate and extends from the flexible substrate.

According to another aspect of the present disclosure, a trim part for a motor vehicle is provide. The trim part includes a rigid substrate, a translucent cover, and a flexible circuit board disposed between the rigid substrate and the translucent cover. The flexible circuit board includes a flexible substrate having a first portion, a second portion, and a first side, and electrical components disposed on the first side in the first portion and in the second portion. The flexible substrate is folded between the first portion and the second portion such that the first portion overlays the second portion and the first side is directed outwards towards the rigid substrate and the translucent cover.

In one aspect, the electrical components include an LED and a capacitive touch sensor, the capacitive touch sensor disposed adjacent the translucent cover, the LED disposed adjacent the rigid substrate.

In another aspect, the first portion includes a first opening and the second portion includes a second opening, and a light guide is disposed in the first opening, wherein the LED is disposed adjacent the first opening and the light guide directs a light from the LED through the second opening and the translucent cover.

In another aspect, a decorative film is disposed between the flexible circuit board and the translucent cover.

According to another aspect of the present disclosure a trim part for a motor vehicle is provided. The trim part includes a rigid substrate, a cover formed of an at least semi-translucent material, the cover defining a portion of an exterior of the trim part, and a flexible circuit board disposed between the rigid substrate and the cover. The flexible circuit board includes a flexible substrate having a first portion, a second portion, and a first side, a first opening through the flexible substrate and disposed in the first portion, a light guide disposed within the first opening, an LED disposed on the first side adjacent the light guide, a second opening through the flexible substrate and disposed in the second portion, and a capacitive touch sensor disposed on the first side adjacent the second opening. The flexible substrate is folded between the first portion and the second portion such that the first opening is aligned with the second opening and the first portion is adjacent the rigid substrate and the second portion is adjacent the translucent cover.

BRIEF DESCRIPTION OF THE DRAWINGS

The drawings described herein are for illustration purposes only and are not intended to limit the scope of the present disclosure in any way. The components in the figures are not necessarily to scale, emphasis instead being placed upon illustrating the principles of the invention. Moreover, in the figures, like reference numerals designate corresponding parts throughout the views. In the drawings.

DETAILED DESCRIPTION

Figure 1:
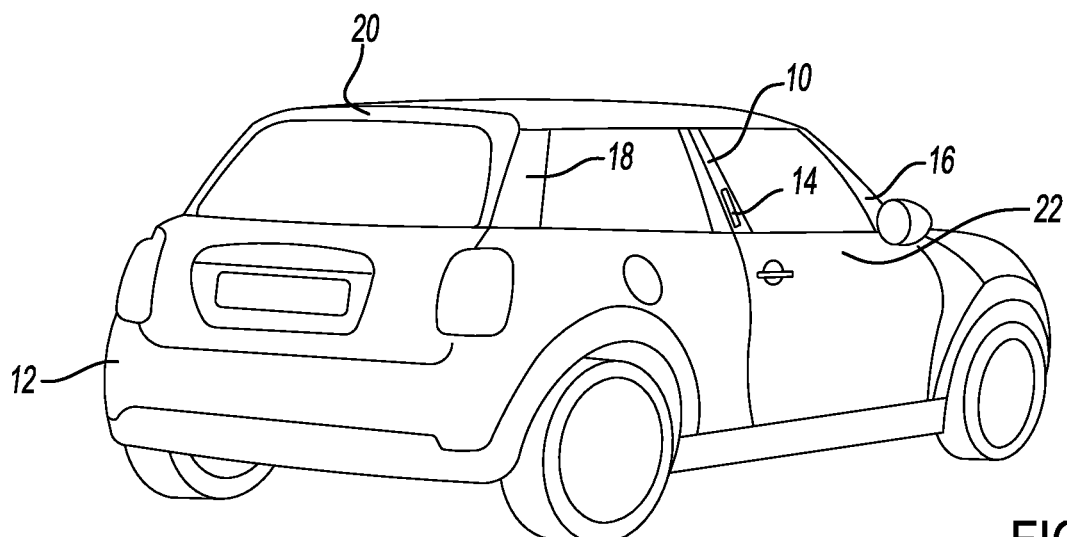
FIG. 1 is a perspective view of an exemplary motor vehicle having a trim part having a foldable flexible circuit board, according to the principles of the present disclosure.

Referring to FIG. 1, an exemplary trim part 10 having a foldable flexible circuit board according to the principles of the present disclosure is shown with an exemplary motor vehicle 12. The motor vehicle 12 is illustrated as a passenger vehicle, however, the motor vehicle 12 may be any type of motor vehicle 12, including a truck, van, motor home, sport utility vehicle, etc. The trim part 10 forms a portion of an exterior surface of the motor vehicle 12. The trim part 10 includes a human machine interface (HMI) 14. The trim part 10 is illustrated as a B-pillar trim part. However, it should be appreciated that the teachings of the present disclosure may be applied to various other exterior trim parts, including, but not limited to, an A-pillar exterior trim part 16, a C-pillar exterior trim 18, a spoiler exterior trim part 20, a side panel 22, etc.

Figure 2:
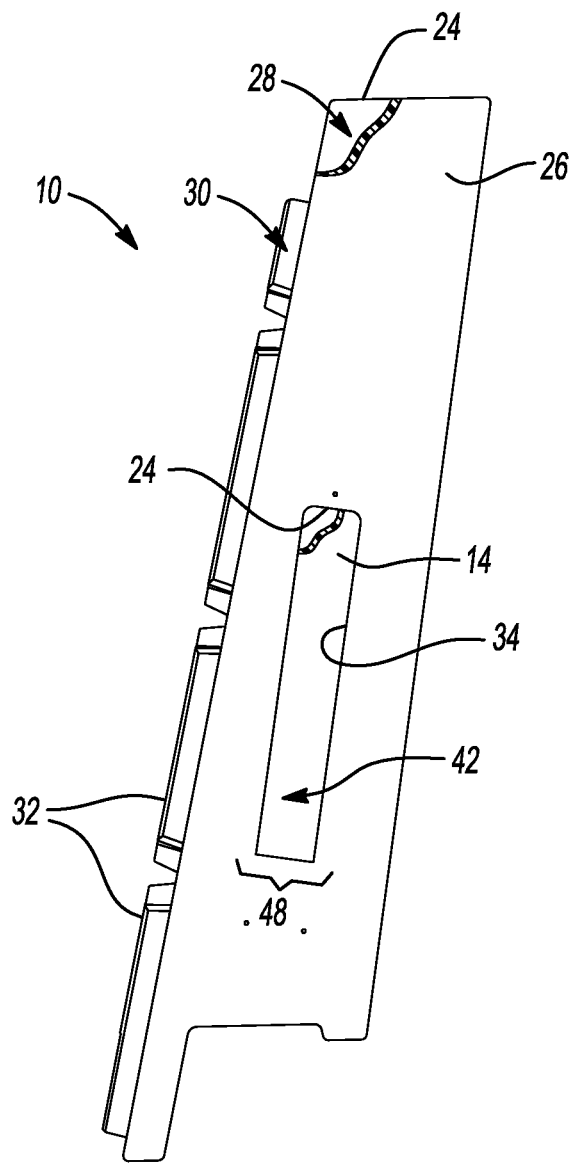
FIG. 2 is a front view of the exterior trim part of the motor vehicle.

FIG. 2 shows an enlarged view of the trim part 10. The trim part 10 generally includes a substrate 24 and an exterior cover 26. The substrate 24 is rigid and has a front decorative surface 28. In one aspect, the front decorative surface 28 is glossy and optically continuous. The substrate 24 also includes an interior surface 30 disposed underneath the front decorative surface 28. The interior surface 30 includes various flanges, fasteners, and other features, for example mounting tabs 32, used to provide structural support to the substrate 24 and to facilitate connecting the trim part 10 to the motor vehicle 12. The substrate 24 further includes a cutout or recess 34 that supports the HMI device 14 therein. The exterior cover 26 is at least partially translucent, translucent or semi-translucent. The exterior cover 26 is disposed overtop the substrate 24 and the HMI device 14. The exterior cover 26 forms a portion of the exterior surface of the motor vehicle 12.

Figure 3:
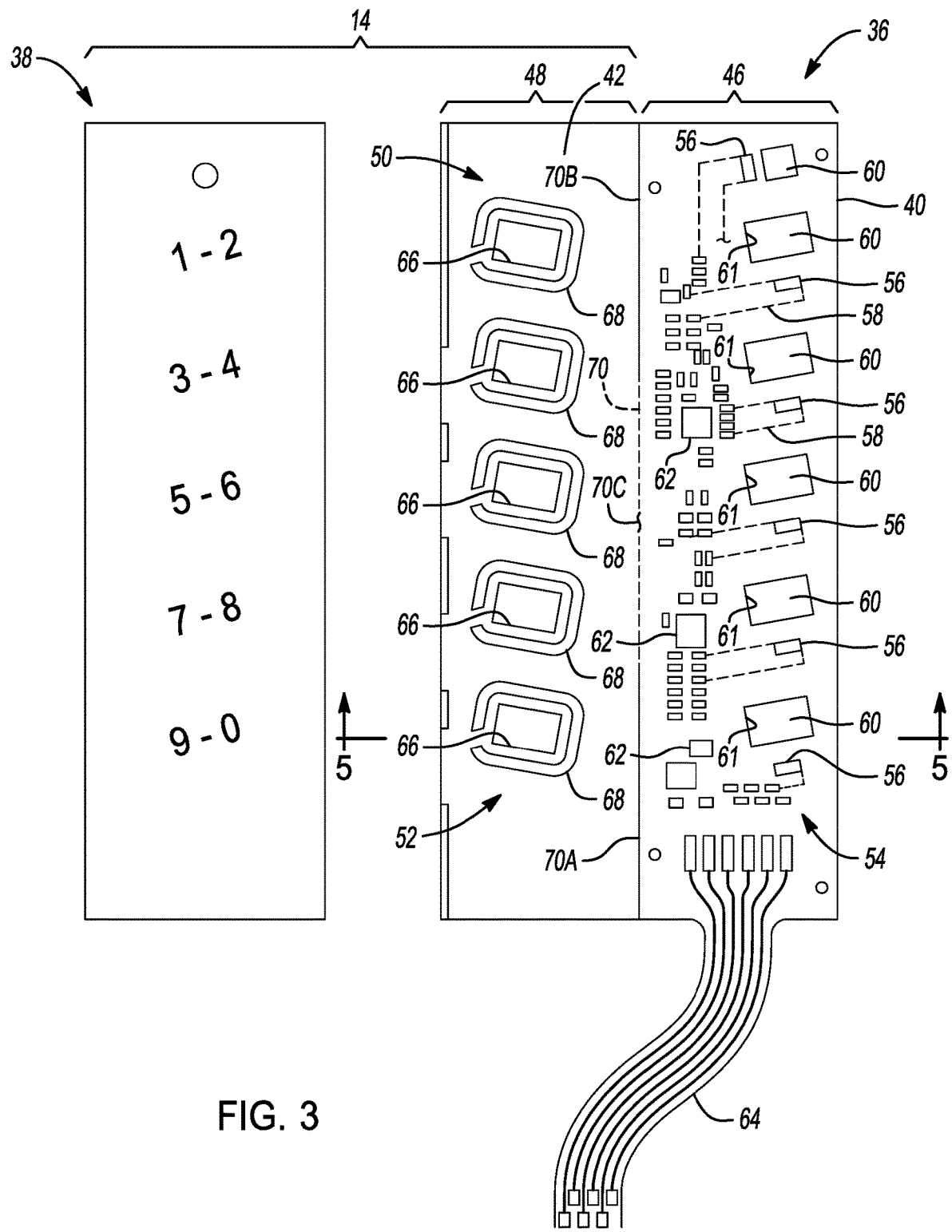
FIG. 3 is an exploded front view of an human machine interface device including a film and a foldable flexible circuit board used in the exterior trim of the motor vehicle according to the principles of the present disclosure.

FIG. 3 shows an exploded view of a portion of the HMI device 14 separate from the trim part 10. The HMI device 14 is used as an input and/or output device. As an input device, a user may enter a code or command via and generate an output. The output may be to unlock the motor vehicle 12, start the motor, etc. The HMI device 14 generally includes a foldable flexible circuit board (FCB) 36 and a film 38. The HMI device 14 may include additional components without departing from the scope of the present disclosure.

Figure 4:
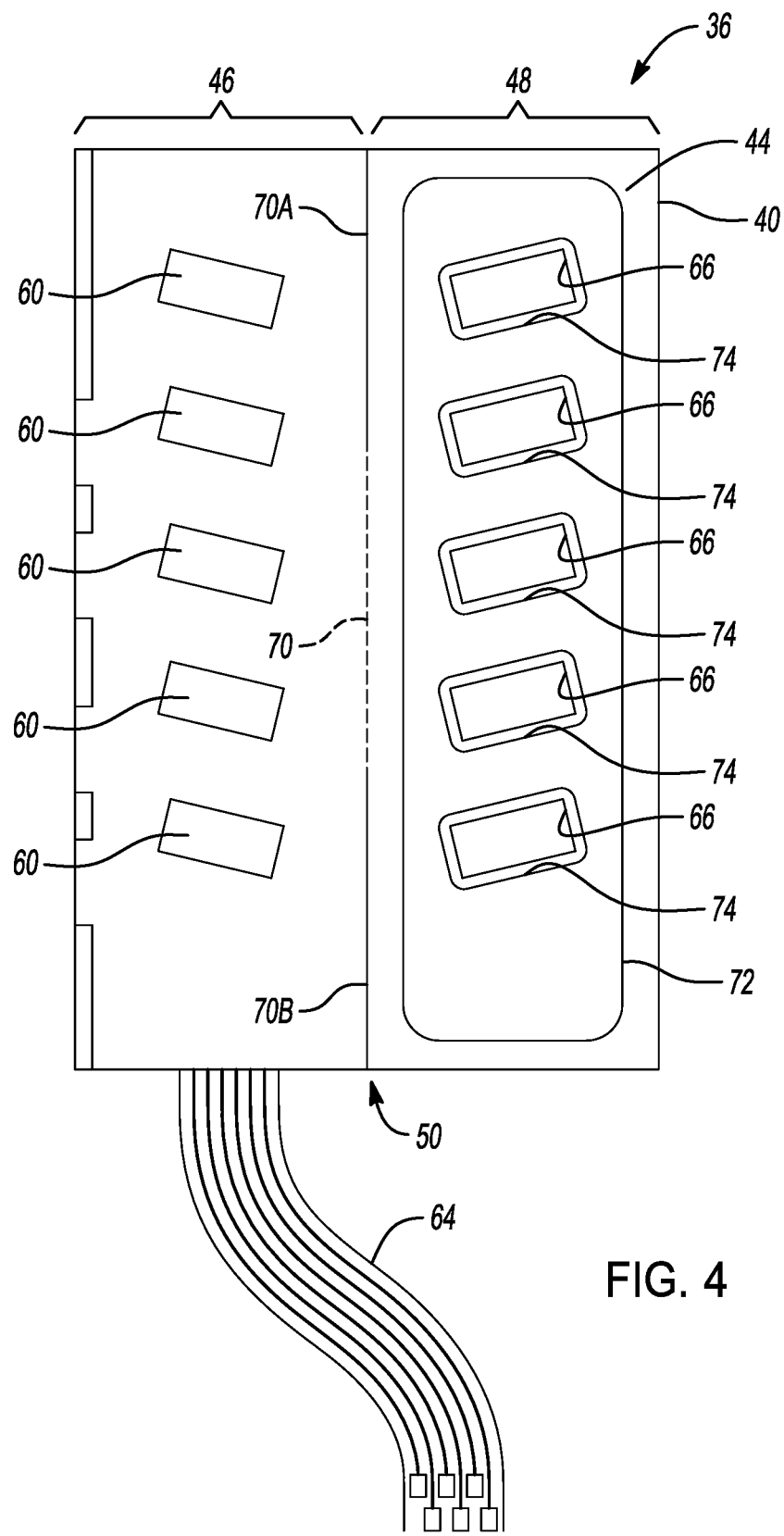
FIG. 4 is a back view of the foldable flexible circuit board.

With reference to FIG. 4 and continued reference to FIG. 3, the foldable FCB 36 includes a flexible substrate 40. The flexible substrate may be made from Polyethylene Terephthalate (PET) or Polyetherimide (PEI) or various other flexible materials. The flexible substrate 40 includes a first side 42 (FIG. 3) and a second side 44 (FIG. 4). The flexible substrate 40 is further divided into a first portion 46 and a second portion 48. The first portion 46 is disposed laterally adjacent the second portion 48.

The foldable FCB 36 further includes electrical components 50 disposed on the first side 42. The electrical components 50 generally include a control circuit 52 in electrical communication with a touch sensing circuit 54. The control circuit 52 is disposed on the first portion 46. The control circuit 52 includes a number of light emitting diodes (LED's) 56 connected to a number of conductive traces 58 (only a few of which are illustrated for clarity). The LED's 56 are each disposed adjacent a light guide 60. The light guides 60 are disposed in openings 61 that extend through the flexible substrate 40 from the first side 42 to the second side 44. The control circuit 52 may also include various electronic parts 62 connected by the conductive traces 58. The control circuit 52 is connected to a pigtail integrated connector 64.

The touch sensing circuit 54 is disposed on the second portion 48. The touch sensing circuit 54 generally includes a plurality of openings 66 that extend through the flexible substrate 40 from the first side 42 to the second side 44. A capacitive touch sensor 68 is disposed around each of the openings 66. The capacitive touch sensors 68 include X and Y electrodes (not shown) that complete a circuit when closed by a user's touch.

The first portion 46 is separated from the second portion 48 by a fold line 70. The fold line 70 extends longitudinally between the first portion 46 and the second portion 48. In one aspect, the fold line 70 is defined by a first slit 70A, a second slit 70B, and a connection portion 70C disposed between the first slit 70A and the second slit 70B. In another aspect, the fold line 70 does not include slits. In yet another aspect, the first slit 70A and the second slit 70B are replaced with weakened or perforated sections (not shown).

With reference to FIG. 4, a spacer 72 is adhered to other otherwise in contact with the second portion 48 of the second side 44. In one aspect, the second side 44 of the flexible substrate 40 is free of electrical components and provides a planar surface, thus forming a single layer FCB. The spacer 72 includes holes 74 disposed therethrough that align with the openings 66. Alternatively, the spacer 72 may be adhered to or otherwise in contact with to the first portion 46 of the second side 44. In one aspect, the spacer 72 is an adhesive tape. In another aspect, the spacer 72 is a polymer adhered to the second side 44 using an adhesive coating (not shown). In another aspect, the spacer 72 acts as a stiffener to provide structural support to the flexible FCB 36 during over molding to create the trim part 10, as described below.

Figure 5:
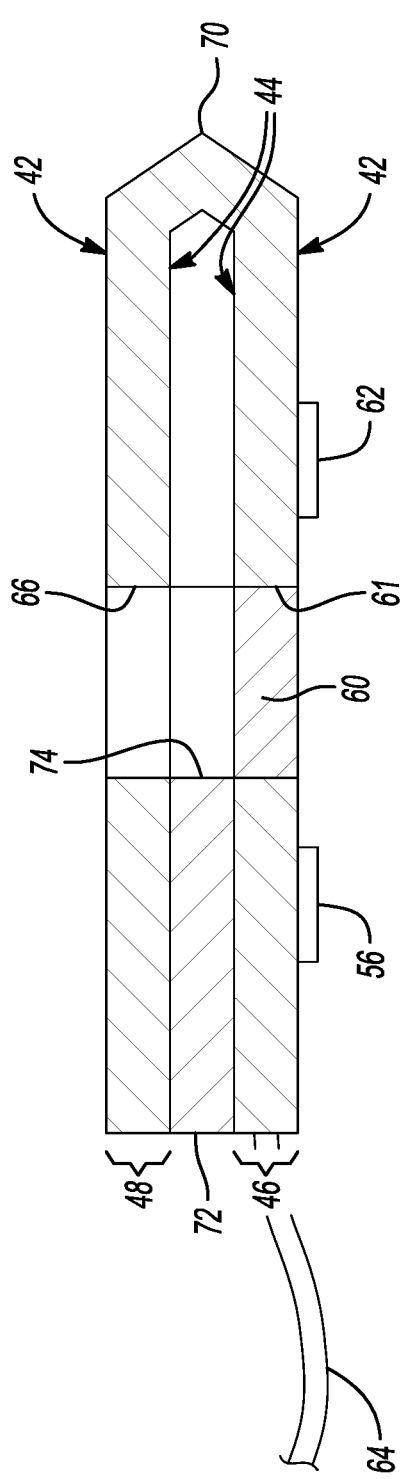
FIG. 5 is a cross-section of the foldable flexible circuit board after being folded viewed in the direction of arrows 5-5 in FIG. 3.

Prior to assembly with the trim part 10, the foldable FCB 36 is folded along the fold line 70 such that the first portion 42 overlays the second portion 44. As used herein, "folded" includes forming an angle, corner, small radius bend or other configuration along the fold line 70 that allows the first portion 42 to overlay the second portion 44. FIG. 5 shows a side view of the foldable FCB 36 after folding. When folded, the second side 44 faces inwardly while the first side 42 faces outwardly. In addition, the opening 61 and light guide 60 of the first portion 46 aligns with the hole 74 of the spacer 72 and the opening 66 in the second portion 48. Thus, when energized, light from the LED 56 is provided to the first side 42 of the second portion 48 through the light guide 60 and the hole 74 and the opening 66. The foldable FCB 36 may be secured by adhering the spacer 72 to the first portion 46 and the second portion 48 of the second side 44.

Returning to FIG. 3, after the foldable FCB 36 has been folded, the film 38 is disposed overtop the first side 42 of the second portion 48, i.e. overtop the touch sensing circuit 54. The film 38 may include translucent, partially translucent, or translucent portions that depict numbers, images, etc. To form the trim part 10, the HMI device 14 is placed in a mold (not shown), and a first shot is injection molded onto the HMI device 14 to form the substrate 24. Next, a second shot is injection molded onto the HMI device 14 to form the exterior cover 26. Thus, returning to FIG. 2, the second portion 48 of the first side 42 contacts the exterior cover 26 and the first portion 46 of the first side 42 contacts the substrate 24. Additional layers and processes may be used to finish the trim part 10.

Figure 6:
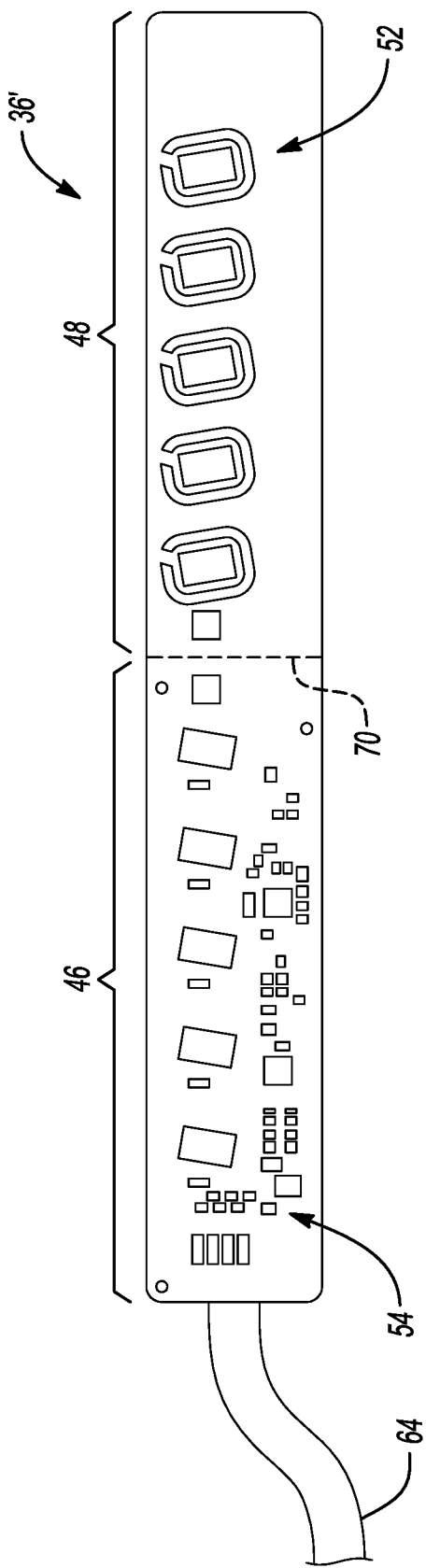
FIG. 6 is a front view of an alternate flexible circuit board according to the principles of the present disclosure.

Turning to FIG. 6, an alternate foldable FCB 36' is illustrated. The foldable FCB 36' is similar to the foldable FCB 36 and like components are indicated by like reference numbers. However, the foldable FCB 36 has the first portion 46 disposed longitudinally adjacent the second portion 48. Thus, the fold line 70 extends laterally between the first portion 46 and the second portion 48. When folded, the first portion 46 overlays the second portion 48, as described above.

The foldable FCB 36, 36' provides many of the advantages of flexible circuit boards with rigid circuit boards. The foldable FCB 36, 36' provides a two sided circuit board assembly while reducing the complexity of manufacturing. The foldable FCB 36, 36' allows the pigtail integrated connector 64 to be integrally formed with the flexible substrate 40, thus reducing the number of electrical joints or connectors. In addition, the foldable FCB 36, 36' provides an increased ability to conform to bent or curved trim parts relative to rigid circuit boards. Finally, the coefficient of thermal expansion of the foldable FCB 36, 36' is better matched to the coefficient of thermal expansion of the substrate 24 and exterior cover 26 relative to rigid circuit boards.

The terms "exterior", "outwardly", "longitudinally", and "laterally" are terms used relative to the orientation of the trim part 10 and foldable FCB 36 as shown in the drawings of the present application. Thus, while the orientation of the trim part 10 and foldable FCB 36 may change with respect to a given use, these terms are intended to still apply relative to the orientation of the components of the trim part 10 and foldable FCB 36 as shown in the drawings.

Additionally, in the claims and specification, certain elements are designated as "first" and "second". These are arbitrary designations intended to be consistent only in the section in which they appear, i.e. the specification or the claims or the summary, and are not necessarily consistent between the specification, the claims, and the summary. In that sense they are not intended to limit the elements in any way and a "second" element labeled as such in the claim may or may not refer to a "second" element labeled as such in the specification. Instead, the elements are distinguishable by their disposition, description, connections, and function.

The features and components of the present invention described above are merely exemplary in nature. Variations that do not depart from the gist of the invention are intended to be within the scope of the invention. Such variations are not to be regarded as a departure from the spirit and scope of the invention.

The following is claimed:

1. A flexible circuit board comprising:
a flexible substrate having a first portion, a second portion, and a first side defining part of the first portion and the second portion; and
electrical components disposed on the first side in the first portion and in the second portion, and
wherein the flexible substrate is folded between the first portion and the second portion such that the first portion overlays the second portion and the first side is directed outwards, wherein the electrical components include an LED on the first side in the first portion, wherein a light from the LED is provided to the first side of the second portion, and wherein the first portion includes a first opening and the second portion includes a second opening, the LED disposed adjacent the first opening.

2. The flexible circuit board of claim 1, further comprising a light guide disposed in the first opening and configured to direct the light from the LED through the second opening.

3. The flexible circuit board of claim 2, wherein the electrical components include a capacitive touch sensor disposed on the first side in the second portion.

4. The flexible circuit board of claim 3, wherein the capacitive touch sensor is disposed around the second opening.

5. The flexible circuit board of claim 1, wherein the first opening is aligned with the second opening when the flexible substrate is folded.

6. The flexible circuit board of claim 1, further comprising an adhesive tape disposed on a second side of the flexible substrate, wherein the adhesive tape adheres the first portion to the second portion.

7. The flexible circuit board of claim 6, wherein the adhesive tape includes a hole in alignment with the first opening and the second opening when the flexible substrate is folded.

8. The flexible circuit board of claim 1, wherein the electrical components include an LED disposed on the first side in the first portion and a capacitive touch sensor disposed on the first side in the second portion.

9. The flexible circuit board of claim 1, further comprising a spacer disposed on a second side of the flexible substrate, wherein the spacer contacts the first portion and the second portion and stiffens the flexible substrate.

10. The flexible circuit board of claim 1, wherein the first portion is disposed laterally adjacent the second portion and the flexible substrate is folded longitudinally.

11. The flexible circuit board of claim 1, wherein the first portion is disposed longitudinally adjacent the second portion and the flexible substrate is folded laterally.

12. The flexible circuit board of claim 11, wherein the flexible substrate includes slits disposed between the first portion and the second portion along a fold line.

13. The flexible circuit board of claim 1, further comprising a connector integrated into the flexible substrate and extending from the flexible substrate.

14. A trim part for a motor vehicle, the trim part comprising:
a rigid substrate;
a translucent cover; and
a single-layer flexible circuit board disposed between the rigid substrate and the translucent cover, the single-layer flexible circuit board having:
a flexible substrate having a first portion, a second portion, and a first side; and
electrical components disposed on the first side in the first portion and in the second portion, and
wherein the flexible substrate is folded between the first portion and the second portion such that the first portion overlays the second portion and the first side is directed outwards towards the rigid substrate and the translucent cover.

15. The trim part of claim 14, wherein the electrical components include an LED and a capacitive touch sensor, the capacitive touch sensor disposed adjacent the translucent cover, the LED disposed adjacent the rigid substrate.

16. The trim part of claim 15, wherein the first portion includes a first opening and the second portion includes a second opening, and a light guide is disposed in the first opening, wherein the LED is disposed adjacent the first opening and the light guide directs a light from the LED through the second opening and the translucent cover.

17. The trim part of claim 15, further comprising a decorative film disposed between the flexible circuit board and the translucent cover.

18. A trim part for a motor vehicle, the trim part comprising:
a rigid substrate;
a cover formed of an at least semi-translucent material, the cover defining a portion of an exterior of the trim part; and
a flexible circuit board disposed between the rigid substrate and the cover, the flexible circuit board having:
a flexible substrate having a first portion, a second portion, and a first side;
a first opening through the flexible substrate and disposed in the first portion;
a light guide disposed within the first opening;
an LED disposed on the first side adjacent the light guide;
a second opening through the flexible substrate and disposed in the second portion;
a capacitive touch sensor disposed on the first side adjacent the second opening, and
wherein the flexible substrate is folded between the first portion and the second portion such that the first opening is aligned with the second opening and the first portion is adjacent the rigid substrate and the second portion is adjacent the cover.

* * * * *